United States Patent [19]

Huignard et al.

[11] 4,138,189
[45] Feb. 6, 1979

[54] HOLOGRAPHY USING A $Bi_{12}SiO$ OR $Bi_{12}GeO_{20}$ RECORDING MEDIUM

[75] Inventors: Jean-Pierre Huignard; Jean-Pierre Herriau; François Micheron, all of Paris, France

[73] Assignee: Thomson-CSF, Paris, France

[21] Appl. No.: 812,599

[22] Filed: Jul. 1, 1977

[30] Foreign Application Priority Data

Aug. 19, 1976 [FR] France .................. 76 25231

[51] Int. Cl.$^2$ .................. G03H 1/02; G03H 1/26
[52] U.S. Cl. .................. 350/3.64; 350/3.75; 365/216
[58] Field of Search .................. 350/3.64, 3.75, 3.78, 350/3.74, 150, 356; 365/117, 119, 125, 216

[56] References Cited

U.S. PATENT DOCUMENTS

| 3,652,145 | 3/1972 | Thaxter | 350/3.64 |
| 3,782,802 | 1/1974 | Micheron et al. | 350/3.64 |
| 3,935,441 | 1/1976 | Aldrich et al. | 365/117 |
| 3,940,201 | 2/1976 | Micheron et al. | 350/3.74 |

OTHER PUBLICATIONS

Micheron et al., *Optics Communications*, vol. 18, No. 2, Jul. 1976, pp. 216-217.
d'Auria et al., *Revue Technique Thomson-CSF*, vol. 6, No. 2, Jun. 1974, pp. 499-527.
Huignard et al., *Applied Physics Letters*, vol. 26, No. 5, Mar. 1975, pp. 256-258.

*Primary Examiner*—Ronald J. Stern
*Attorney, Agent, or Firm*—Cushman, Darby & Cushman

[57] ABSTRACT

A holographic storage cell for storing volume holograms wherein a plate of either $Bi_{12}SiO_{20}$ or $Bi_{12}GeO_{20}$ is provided with electrodes producing an electric field transversed to the plate. These electrodes may be on opposite ends of the plate, or in the form of interdigitated combs. In one embodiment, such a cell is utilized as a holographic memory wherein the modulation of the object beam and the deflection of the reference and object beams are controlled electronically. The cell may also be utilized to perform calculations by superpositioning data to perform addition and substraction.

8 Claims, 3 Drawing Figures

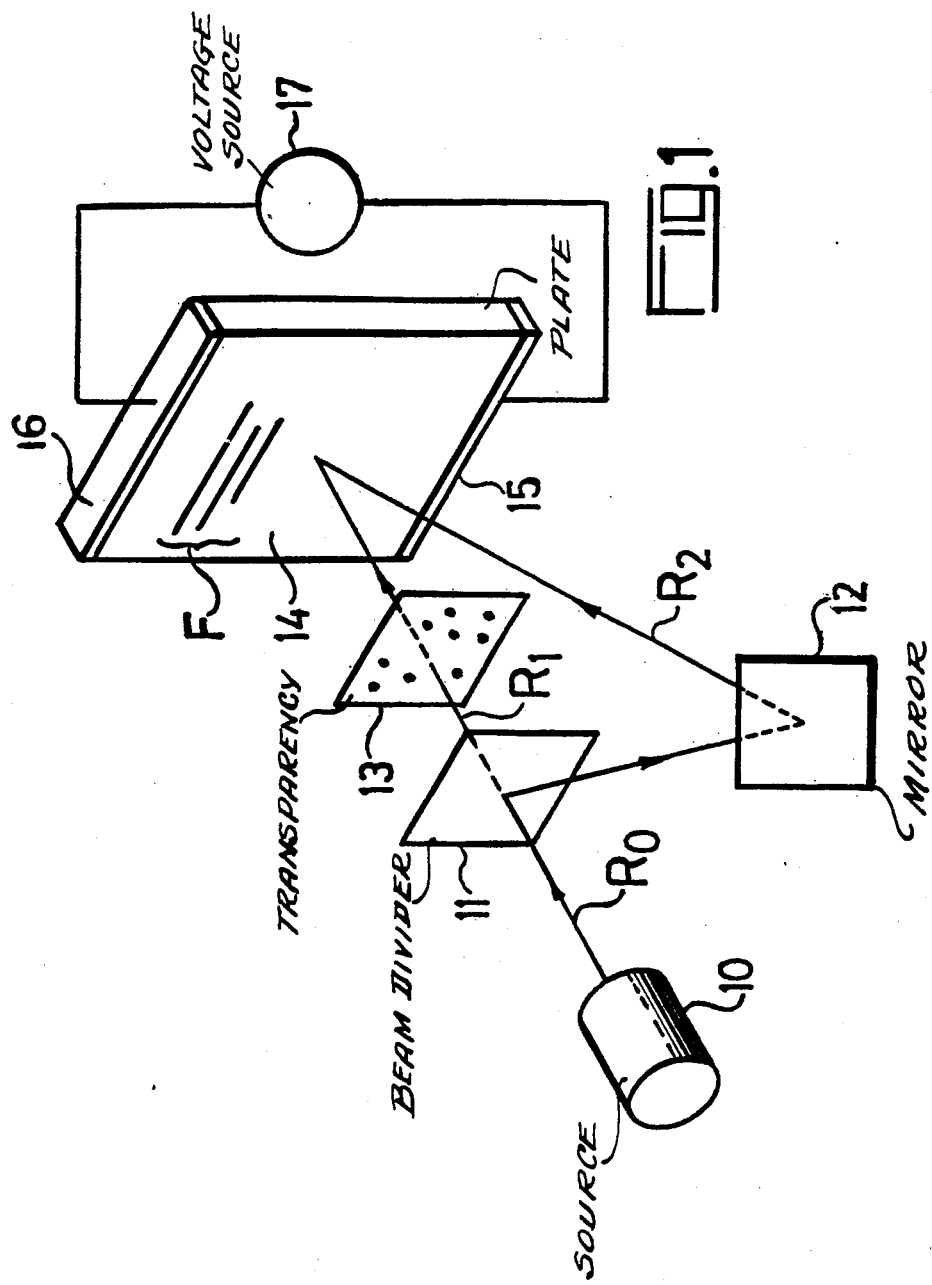

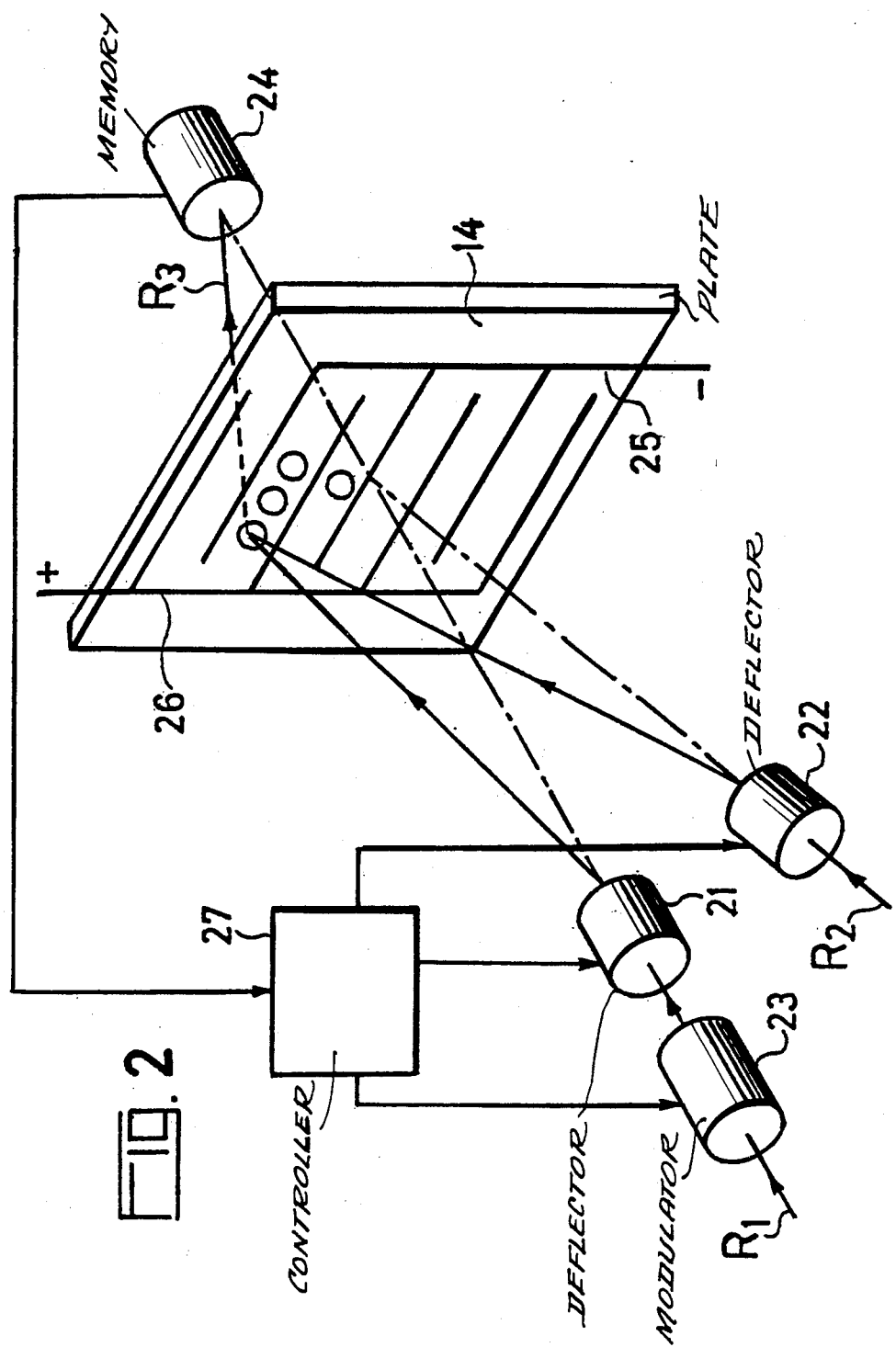

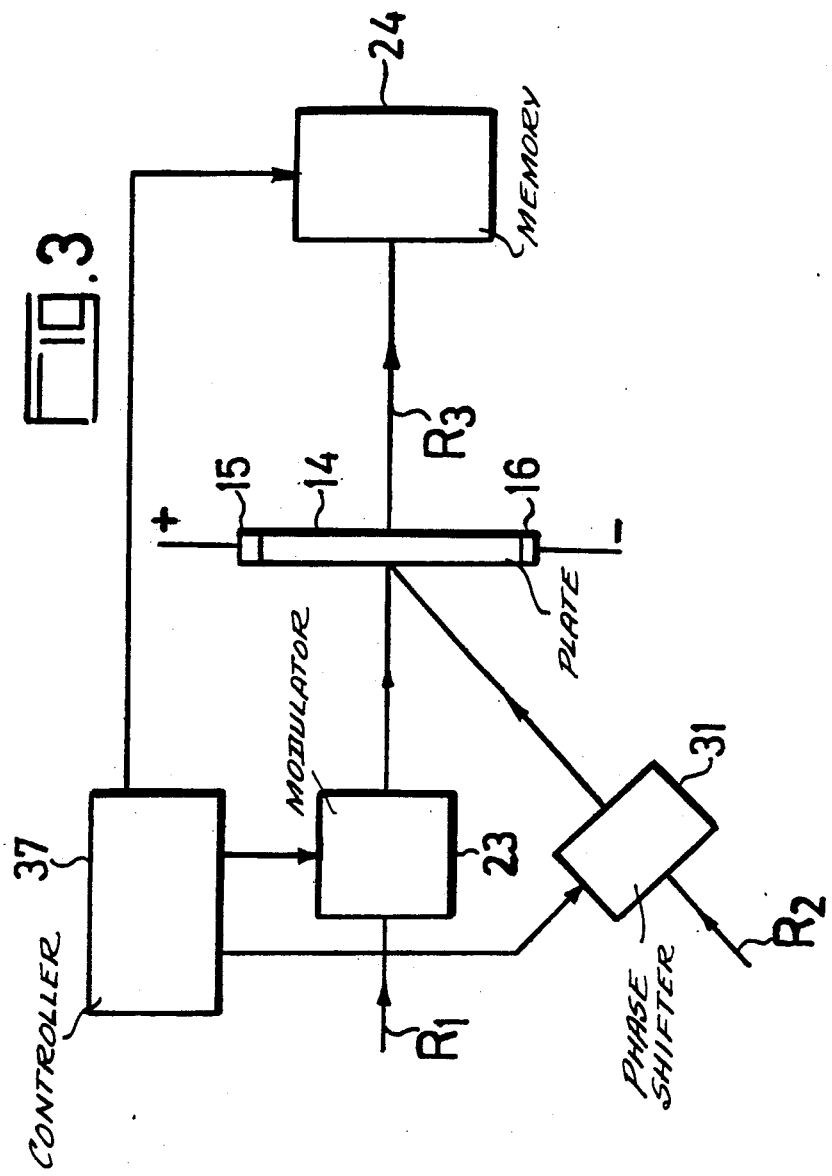

HOLOGRAPHY USING A $Bi_{12}SiO$ OR $Bi_{12}GeO_{20}$ RECORDING MEDIUM

The invention is concerned with holographic storage cells which make it possible to store holograms in an eraseable manner in a sensitive electro-optical and photoconductive environment. It is also concerned with memories and devices for optical calculation using such a cell, for example, to carry out successive calculations by a direct combination of these holographic registrations in the sensitive environment.

Storing a hologram in a material such as the niobate of lithium ($LiNbO_3$) is a familiar process. The principal inconvenience with respect to this material and similar materials used up to the present is their slight sensitivity by comparison with the photographic emulsions, for example, that are used for the same purpose.

Also, the storage of images in electro-optical and photoconductive materials such as $Bi_{12}Si O_{20}$ and $Bi_{12}Ge O_{20}$ by applying a longitudinal electrical field to a plate of such a material, with the field generated by means of two transparent electrodes applied to the faces of that plate is also known. The image is projected onto the plate and stored there in the form of local variations of the refraction index. One can then examine that image under a light that does not produce the photoconductive effect, using two crossed polarizers to reveal the index variations. Unfortunately, such a device offers a weak resolution because of the migration of photoelectric charges in the thickness of the plate.

The purpose of the invention is to produce a holographic storage cell comprising a plate of one of these two materials subjected to a transverse electric field, parallel to a preferred crystalline axis of that plate. In this way, one can store volume holograms with great resolution and great sensitivity — comparable in both cases to the characteristics of photographic emulsions.

Other details and advantages of the invention will appear clearly from the description which follows, which is presented as a nonlimiting example and refers to the annexed diagrams, which represent the following:

FIG. 1: A holographic storage device.
FIG. 2: A holographic memory.
FIG. 3: A device for optical calculation.

The device shown in FIG. 1 makes it possible to store a volume hologram in a storage cell of the type called for by the invention. The device consists of a source of coherent light 10, a beam divider 11, a mirror 12, a diapositive or slide 13, a sensitive plate 14, two electrodes 15 and 16 and a constant voltage source 17.

The coherent source of light 10, a laser with a beam-broadening optical system, for example, emits a luminous beam represented in the diagram by its median ray Ro. The beam divider 11, working with the mirror 12, makes it possible to obtain an object beam $R_1$ and a reference beam $R_2$, which are represented on the diagram in accordance with the same convention as Ro. This optical element is arranged in such a way that the beams $R_1$ and $R_2$ interfere with each other. The sensitive plate 14 is placed in the zone of interference, so that the fringes produced are approximately parallel to the electrodes 15 and 16.

The object beam $R_1$ passes through transparency 13, which is a film of the image to be registered. That image may be made up, as in the diagram, of a series of points representing bits to be stored in memory. $R_1$ is then modulated by the transparency.

The interference of $R_1$, modulated by transparency 13 and $R_2$ gives rise to a volume hologram which is stored in the sensitive plate 14 in the form of fringes, some of which (F) are represented in FIG. 1.

In order to obtain this storage, one utilizes one of the two materials $Bi_{12} Si O_{20}$ or $Bi_{12} Ge O_{20}$ for the plate 14. This plate 14 is subjected, due to the constant voltage source 17, to a transverse electric field E parallel to a preferred crystalline axis (axis [001], for example) of the plate 14 and approximately perpendicular to the direction of the fringes F. The physical process of storage seems to be the following: the photoelectrons liberated in the illuminated portions of the fringes migrate under the influence of the electric field E and are trapped again in a random manner; if the average distance L of migration of these electrons before they are trapped again is large in view of the pitch, $\lambda$, of the fringes, one obtains an electric field structure corresponding to the structure of the fringes; that field structure then locally modifies the refraction index of the material due to an electro-optical effect, which then makes it possible to read the hologram.

The above-mentioned materials make it possible to obtain a sufficient distance L by application of a sufficiently high field. In practice, a distance of $L = 8 \mu m$ was obtained for a field of 6 KV/cm; with the hologram being stored with a laser with a wave length of 514 nm, the pitch of the fringes was approximately $\lambda = 1 \mu m$ and the difference between L and $\lambda$ made it possible to obtain a very good storage with a diffraction efficiency of 20% at saturation. Resolution is excellent and the sensitivity is comparable to that of a photographic plate.

To read the recording, it is necessary, since it is a volume homogram, to use a reading beam of the same wave length as the recording. For example, one can obstruct the beam $R_1$, which brings about the appearance of a virtual image at the location of the transparency 13. That image can be captured by a lens placed behind the plate 14 with respect to the source of light 10 and which makes it possible to focus the virtual image in conformity with a real image placed at a desired location.

This device is very interesting in connection with storing holograms of the type called Fourier holograms — that is, those whose beam phase centers are modulated by the object to be recorded and the reference beams are very close to one another.

It has been observed that the registration-obliteration cycle of the materials used is symmetrical, which consequently means that the reading is necessarily destructive since, as we saw earlier, one must use a reading light of the same wave length. Thus a cell should be used with special apparatus that take that characteristic into account.

FIG. 2 represents a holographic memory using a cell of the type called for by the invention. The structure of that cell is slightly different from that described above. In fact, it has been observed that, in connection with the interpretation of the physical process of the recording, the direction of the electrical field E applied to the material is unimportant so long as its direction is transverse in the way described above. This makes it possible to utilize electrodes in the form of interdigitated combs, such as 25 and 26. Since the distance between the teeth of the combs may be slight, one can obtain the necessary electric field E (about 6 kv/cm) by using weaker voltages. Because of this fact, the sensitive plate 14 can be of large size without any disadvantages. In the version shown in the diagram, a series of holograms are recorded between the teeth of the electrodes, so that the electrodes do not obstruct any part of those holograms. For purposes of clarity, only four of those holograms are shown, in the form of small circles, in FIG. 2.

This memory consists of the cell 14, 25 and 26, an electro-optical modulator 23, two electro-optical deflectors 21 and 22, memory means 24 and a control device 27.

An optical device which is not shown and is similar to that in FIG. 1 furnishes a object beam $R_1$ and a reference beam $R_2$.

The object beam $R_1$ passes through the modulator 23, which plays the role of the tranparency 13. This modulator is necessary because of the rapidity of access desired with a memory. Memory means 24 may be a Pockel-effect cell whose index is caused to vary locally under the influence of television type electronic scanning. It has been described in a number of publications.

The signals defining the image to be stored — a network of points representing binary elements, for example — come from the control device 27, which is well known in the art, consisting of an arrangement of logical circuits.

The $R_1$ beam modulated in this way passes through the deflector 21, which, under the influence of the control signals coming from the device 27, deflects it in such a way that it falls on the plate 14 at a specific location corresponding to the page of the holographic memory one desires to record.

The reference beam $R_2$ passes through the deflector 22, which, under the influence of the control signals coming from the device 27, deflects it in such a way that it interferes with the beam $R_1$ at the specific location on the plate 14.

In this way, one can carry out the recording of the different pages of the memory.

In order to read one of these pages, one obstructs $R_1$ by means of the modulator 23 and directs $R_2$ toward the spot to be read by means of the deflector 22. In this way one obtains a virtual image of the page which corresponds to the reading beam $R_3$, which is intercepted by the memory means 24. We use the name memory means to designate a complete unit comprising, in particular, the optical device intended to focus the image transmitted by $R_3$. This tube is placed symmetrically to the deflector 21 with respect to the plate 14, and as a result all the beams $R_3$, corresponding to all the pages of the memory, pass through its input optical system. Such memory means are used in radar, for example. They make it possible to preserve the image that has been read and to restore it.

It is necessary to use such a memory means since, as we have seen, reading the holographic cell is destructive. Thus, one can use the contents of the page that has been read sequentially, and those contents are placed in memory means 24 in this way.

Frequently, there will be a need to preserve the contents of the page that has been read — particularly when one has only used a part of it — when one has another page to read. A memory of the type called for by the invention, then, makes it possible to rerecord that page at the location previously read. For this purpose, the reading signals of the memory means 24 are addressed to the controller 27, which retransmits them to the modulator 23 and also addresses control signals to the deflectors 21 and 22, making it possible to direct the beams $R_1$ and $R_2$ toward the intended spot on the plate 14. Moreover, it is preferable to carry out a systematic rerecording after each reading, while maintaining the ability to prevent rerecording in selected instances.

FIG. 3 represents an optical calculation device using a cell of the type called for by the invention consisting of a control device 37, an electro-optical modulator 23, a phase-shifter 31 and a memory means 24. This calculation device makes it possible to carry out operation A-B between two pages of information identified as A and B, for example.

In order to do this, one first stores page A in the cell made up of the sensitive plate 14 and the electrodes 15 and 16, utilizing the recording beam $R_1$ and the reference beam $R_2$. $R_1$ and $R_2$ are provided by an optical system which is not shown and which is similar to that in FIG. 1. $R_1$ is modulated in the modulator 23, which functions under the control of the device 37. This device 37 is a simple combination of logical circuits that makes it possible to control the sequence of operations and also to apply the modulation to the imager 23. $R_2$ passes through the phase-shifter 31, which is inactive in this stage.

Then one stores page B in the same way, but with beam $R_2$ undergoing a phase shift of $\pi$ by means of the phase-shifter 31. Consequently, the recorded hologram of B in the plate 14 is inverted with respect to that of A and the hologram resulting from the superposition corresponds to a page whose contents would be A-B.

One then reads the contents of the cell by directing the reference beam $R_2$, not phase shifted toward the spot to be read, and by obstructing $R_1$ by means of the modulator 23. The image obtained is intercepted again by the memory means 24, which is similar to that in FIG. 2. That tube is put into operation during this reading at the command of device 37. The result of the operation A-B is then stored in the memory means 24, and it is of course obliterated in the cell since the reading is destructive. One can then use the page A-B in any desired manner, taking it from the memory means 24.

Naturally, this example is not the only possible use to which such a device can be put. Other computations can be carried out, using another sequence of recordings and reference beam phases.

We claim:

1. A holographic storage cell for storing volume holograms comprising:
   a plate of sensitive material having a face, said sensitive material chosen from the group consisting of $Bi_{12} Si\ O_{20}$ and $Bi_{12} Ge\ O_{20}$ and having a preferred crystalline axis; and
   means for producing a transverse electric field in said plate, said field being parallel to said preferred axis and perpendicular to a given direction, producing fringes substantially parallel to said direction.

2. A cell as described in claim 1, wherein said electric field is approximately equal to 6,000 V/cm.

3. A memory as in claim 1, wherein said sensitive plate has two rectilinear edges, parallel to said direction, and said means for producing comprises two rectilinear electrodes, mounted on said edges.

4. A cell as in claim 1, wherein said means for producing comprises: two electrodes on said face of said plate in the form of interdigitated combs producing said electric field from a relatively low voltage, the teeth of said electrodes being parallel to said direction.

5. Holographic memory intended to store pages of binary information, comprising:
  a storage cell comprising:
    a plate of sensitive material having a face, said sensitive material chosen from the group consisting of $Bi_{12}SiO_{20}$ and $Bi_{12}GeO_{20}$ and having a preferred crystalline axis, and
    two electrodes on said face of said plate in the form of interdigitated combs, for producing a transverse electric field in said plate parallel to said preferred axis and perpendicular to a given direction, the teeth of said electrodes being parallel to said direction and for storing the pages of information side by side;
  a reference beam of coherent light;
  a object beam of coherent light;
  means for directing said object beam and said reference beam onto said cell;
  modulating means for modulating said object beam in accordance with an image representing the page to be stored;
  means for deflecting the modulated said object beam and said reference beam in such a way as to make them interfere with each other at one of said locations;
  means for controlling said deflecting means and said modulating means so as to store at one of said series of locations said image in a recording phase and to reproduce a stored image from one of said locations in a reading phase by obstructing said object beam; and
  memory means for recording the page of information that is read during the reading phase and to reproduce at least a part of the contents of that page upon demand.

6. A memory as in claim 5, wherein said memory means is connected to said controlling means to make it possible to rerecord the page that was read after it has been read.

7. Optical calculation device intended to effect the combining of at least two successive images, including:
  a storage cell comprising:
    a plate of sensitive material having two rectilinear edges parallel to a given direction, said sensitive material chosen from the group consisting of $Bi_{12}SiO_{20}$ and $Bi_{12}GeO_{20}$ and having a preferred crystalline axis, and
    two rectilinear electrodes, mounted on said edges for producing a transverse electric field in said plate, said field being parallel to said preferred axis and perpendicular to said direction;
  a object beam of coherent light;
  a reference beam of coherent light;
  means for directing said object beam and said reference beam onto said cell;
  modulating means for modulating said object beam with each of the images to be combined in a sequence of registration phases, and for reproducing the stored resulting image in a subsequent reading phase by obstructing said object beam;
  memory means for storing the image resulting from the combination that has been read during the reading phase, and for reproducing said image on demand; and
  means for supplying to said modulating means information signals representing the images to be stored and an image totally obstructing said object beam;
  means for controlling said memory means so that the image that has been read may be rerecorded.

8. A device as in claim 7 for carrying out the operation A−B where A and B represent two successive images, further including a phase-shifter controlled by said means for supplying for shifting the phase of said reference beam by $\pi$ while registering B.

* * * * *